United States Patent
Sun (10) Patent No.: US 9,578,750 B2
(45) Date of Patent: *Feb. 21, 2017

(54) PACKAGE CARRIER AND MANUFACTURING METHOD THEREOF

(71) Applicant: Subtron Technology Co., Ltd., Hsinchu County (TW)

(72) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 84 days.

This patent is subject to a terminal disclaimer.

(21) Appl. No.: 14/097,269

(22) Filed: Dec. 5, 2013

(65) Prior Publication Data

US 2015/0090476 A1    Apr. 2, 2015

(30) Foreign Application Priority Data

Sep. 27, 2013   (TW) .............................. 102135022 A (51) Int. Cl.
  *H05K 3/00* (2006.01)
  *H05K 1/18* (2006.01)
  *H05K 3/46* (2006.01)
(52) U.S. Cl.
  CPC ... *H05K 3/0097* (2013.01); *H01L 2224/48091* (2013.01); *H01L 2224/48472* (2013.01);
  (Continued)
(58) Field of Classification Search
  CPC .................................................. H05K 3/0097
  (Continued)

(56) References Cited

U.S. PATENT DOCUMENTS 5,959,256 A * 9/1999 Saida et al. ................. 174/258
6,323,118 B1 * 11/2001 Shih et al. .................... 438/624
(Continued)

FOREIGN PATENT DOCUMENTS

JP    2004095749    3/2004
JP    2007311688    11/2007
(Continued)

OTHER PUBLICATIONS

"Office Action of Taiwan Counterpart Application", issued on Aug. 27, 2014, p. 1-p. 5.

(Continued)

*Primary Examiner* — Jarrett Stark
*Assistant Examiner* — Charles N Ausar-El
(74) *Attorney, Agent, or Firm* — Jianq Chyun IP Office (57) ABSTRACT

A manufacturing of a package carrier includes the following steps. Two base metal layers are bonded together. Two supporting layers are laminated onto the base metal layers respectively. Two release metal films are disposed on the supporting layers respectively. Each release metal film includes a first metal film and a second metal film separable from each other. Two first patterned metal layers are formed on the release metal films respectively. Each first patterned metal layer includes a pad pattern. Two dielectric layers are formed on the release metal films respectively and cover the corresponding first patterned metal layers. Each dielectric layer has a conductive via connecting to the corresponding pad pattern. Two second patterned metal layers are formed on the dielectric layers respectively. Each second patterned metal layer at least covers the conductive via. The base metal layers are separated from each other to form two independent package carriers.

12 Claims, 5 Drawing Sheets

(52) U.S. Cl.
CPC .... *H01L 2924/15311* (2013.01); *H05K 1/186* (2013.01); *H05K 3/4602* (2013.01); *H05K 3/4682* (2013.01); *H05K 2203/1536* (2013.01)

(58) Field of Classification Search
USPC .......................... 174/257, 264; 257/774, 668
See application file for complete search history.

(56) References Cited

U.S. PATENT DOCUMENTS

| | | | | |
|---|---|---|---|---|
| 6,353,997 | B1* | 3/2002 | Su ................................... | 29/830 |
| 7,223,687 | B1* | 5/2007 | Ho ........................ | H05K 3/0058 |
| | | | | 29/829 |
| 2004/0120129 | A1* | 6/2004 | Soto ..................... | H05K 3/0061 |
| | | | | 361/795 |
| 2005/0019535 | A1* | 1/2005 | Vasoya et al. ................ | 428/209 |
| 2006/0200983 | A1* | 9/2006 | Shimamura .............. | H01J 5/08 |
| | | | | 29/847 |
| 2007/0268675 | A1* | 11/2007 | Chinda .............. | H01L 21/4853 |
| | | | | 361/748 |
| 2008/0202661 | A1* | 8/2008 | Kobayashi ...................... | 156/50 |
| 2010/0270653 | A1* | 10/2010 | Leitz et al. ................... | 257/618 |
| 2010/0314037 | A1* | 12/2010 | Liu ..................... | H01L 21/6835 |
| | | | | 156/248 |
| 2011/0088930 | A1* | 4/2011 | Lee ........................ | H05K 3/205 |
| | | | | 174/256 |
| 2011/0154657 | A1* | 6/2011 | Chuang et al. ................. | 29/829 |
| 2011/0154658 | A1* | 6/2011 | Chuang et al. ................. | 29/829 |
| 2011/0253439 | A1* | 10/2011 | Huang ................... | B32B 37/02 |
| | | | | 174/262 |
| 2011/0317383 | A1* | 12/2011 | Guzek .................... | H01L 24/24 |
| | | | | 361/764 |
| 2012/0161316 | A1* | 6/2012 | Gonzalez .............. | H01L 21/568 |
| | | | | 257/738 |
| 2012/0293977 | A1* | 11/2012 | Sun ................................ | 361/820 |
| 2013/0161073 | A1* | 6/2013 | Lee ....................... | H05K 3/4644 |
| | | | | 174/251 |
| 2013/0241071 | A1* | 9/2013 | Hsieh ..................... | H01L 24/13 |
| | | | | 257/773 |
| 2013/0285252 | A1* | 10/2013 | Sun ................................ | 257/774 |
| 2014/0036465 | A1* | 2/2014 | Hu et al. ....................... | 361/767 |
| 2014/0041922 | A1* | 2/2014 | Sun ................................ | 174/264 |
| 2015/0014861 | A1* | 1/2015 | Teh et al. ...................... | 257/774 |
| 2015/0084207 | A1* | 3/2015 | Chauhan et al. ............. | 257/774 |
| 2015/0090476 | A1* | 4/2015 | Sun ....................... | H05K 3/0097 |
| | | | | 174/250 |
| 2015/0090481 | A1* | 4/2015 | Sun ................................ | 174/257 |

FOREIGN PATENT DOCUMENTS

| | | |
|---|---|---|
| JP | 2008004862 | 1/2008 |
| JP | 2008283226 | 11/2008 |
| JP | 2009038134 | 2/2009 |
| JP | 2013021294 | 1/2013 |
| JP | 2013138115 | 7/2013 |
| TW | 200539776 | 12/2005 |
| TW | 200845340 | 11/2008 |
| TW | 201117681 | 5/2011 |
| TW | 201218323 | 5/2012 |
| WO | 2008001915 | 1/2008 |

OTHER PUBLICATIONS

"Office Action of Japan Counterpart Application", issued on Jul. 21, 2015, p. 1-p. 5.

* cited by examiner

PACKAGE CARRIER AND MANUFACTURING METHOD THEREOF

CROSS-REFERENCE TO RELATED APPLICATION

This application claims the priority benefit of Taiwan application serial no. 102135022, filed on Sep. 27, 2013. The entirety of the above-mentioned patent application is hereby incorporated by reference herein and made a part of this specification.

BACKGROUND OF THE INVENTION

Field of the Invention

The invention relates to a package structure and a manufacturing method thereof. More particularly, the invention relates to a package carrier and a manufacturing method thereof.

Description of Related Art

Chip package is used for the purpose of protecting an exposed chip, reducing the density of chip contacts, and providing better heat dissipation for the chip. Common methods for disposing a chip to a package carrier include wire bonding and flip chip bonding, etc., by which contacts of the chip can be electrically connected to the package carrier. Therefore, the distribution of the chip contacts can be reconfigured by the package carrier to conform to the contact distribution of an external device at the next level.

Generally speaking, fabrication of the package carrier is to use a core dielectric layer as core material and then alternately stack patterned circuit layers and patterned dielectric layers on the core dielectric layer by means of a fully additive process, a semi-additive process, a subtractive process, or other processes. Consequently, the core dielectric layer is a large proportion in the whole thickness of the package carrier. Naturally, if the thickness of the core dielectric layer cannot be significantly reduced, it will be difficult to reduce the thickness of the package structure.

SUMMARY OF THE INVENTION

The invention provides a package carrier capable of carrying a chip, and the thickness of a package structure utilizing the package carrier is reduced package thickness.

The invention further provides a manufacturing method for manufacturing the aforementioned package carrier.

The manufacturing method of the package carrier of the invention includes the following steps: first, two base metal layers are bonded together. Then, two supporting layers are laminated onto the two base metal layers respectively. Thereafter, two release metal films are disposed on the two supporting layers respectively, wherein each of the release metal films includes a first metal film and a second metal film that are separable from each other. Next, two first patterned metal layers are formed on the two release metal films respectively. Each of the first patterned metal layers includes a pad pattern. Following that, two dielectric layers are formed on the two release metal films respectively and cover the corresponding first patterned metal layers. Each of the dielectric layers has a conductive via respectively connecting to the corresponding pad pattern. Then, two second patterned metal layers are formed on the two dielectric layers respectively. Each of the second patterned metal layers at least covers a top surface of the corresponding conductive via. Thereafter, the two base metal layers are separated to form two package carriers that are independent from each other.

A package carrier of the invention is capable of carrying a chip, and the package carrier includes a supporting layer, a base metal layer, a release metal film, a first patterned metal layer, a dielectric layer, and a second patterned metal layer. The supporting layer has a first surface and a second surface opposite to the first surface. The base metal layer is disposed on the first surface of the supporting layer. The release metal film is disposed on the second surface of the supporting layer. The release metal film includes a first metal film and a second metal film that are separable from each other, wherein the second metal film is bonded to the supporting layer. The first patterned metal layer is disposed on the release metal film and includes at least one pad pattern. The dielectric layer is disposed on the release metal film and covers the first patterned metal layer. The dielectric layer has at least one conductive via connecting to the corresponding pad pattern. The second patterned metal layer is disposed on the dielectric layer and at least covers a top surface of the corresponding conductive via. The chip is adapted to be disposed on the second patterned metal layer and electrically connected thereto.

Based on the above, the package carriers of the invention are formed by performing the manufacturing method respectively on two bonded base metal layers in a symmetrical way. Thus, after stacking layers are respectively formed on the base metal layers, the bonded base metal layers are separated from each other to obtain two independent package carriers, which effectively saves production time and improves production efficiency. In addition, the dielectric layers are laminated onto the supporting layers and conductive vias and patterned metal layers are formed on the dielectric layers so as to form the stacking layers for carrying and electrically connecting the chips. Moreover, the release metal films are connected between the supporting layers and the patterned metal layers, such that the supporting layers can be easily removed due to the separable characteristics of the release metal films. Therefore, in comparison with the traditional package carrier, the package carrier of the invention helps to reduce the overall thickness of the package structure utilizing the package carrier.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

FIG. 1A to FIG. 1H are schematic cross-sectional views illustrating processes of manufacturing a package carrier according to an embodiment of the invention. In this embodiment, a manufacturing method of the package carrier includes the following steps: first, with reference to FIG. 1A, two base metal layers 110 are bonded together. In this embodiment, the two base metal layers 110 may be two copper foils. An adhesive layer 105 is applied to peripheries of the two base metal layers 110 to bond the two base metal layers 110 together and form a sealed region at the peripheries of the two base metal layers 110, so as to temporarily bond the two base metal layers 110 and prevent chemicals or reagents used in the subsequent processes from permeating between the two base metal layers 110.

Figure 1A:
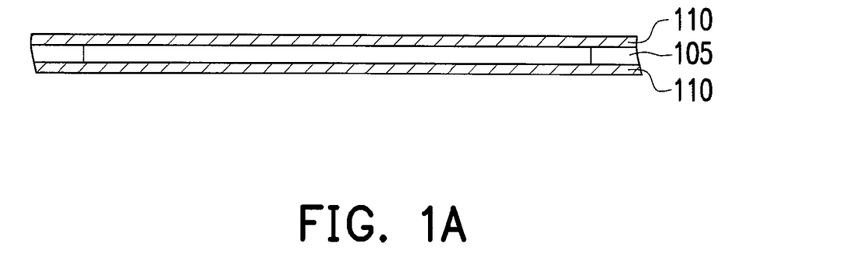
FIG. 1A to FIG. 1H are schematic cross-sectional views illustrating processes of manufacturing a package carrier according to an embodiment of the invention.
Figure 1B:
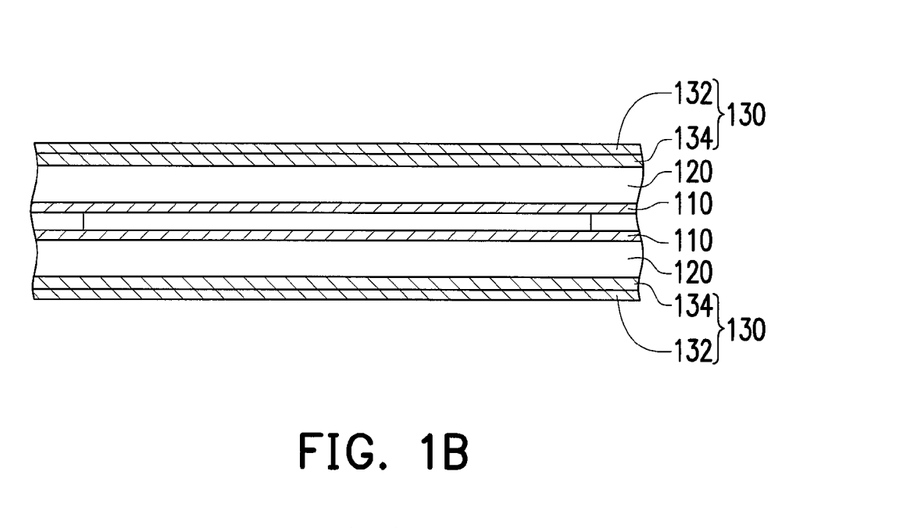

Then, with reference to FIG. 1B, two supporting layers 120 are respectively laminated onto the two base metal layers 110. Thereafter, two release metal films 130 are respectively disposed on the two supporting layers 120, wherein each of the release metal films 130 includes a first metal film 132 and a second metal film 134 that are separable from each other. In this embodiment, a thickness of the second metal film 134 is substantially greater than a thickness of the first metal film 132. More specifically, the thickness of the second metal film 134 is about 18 μm while the thickness of the first metal film 132 is about 5 μm. However, it should be understood that this embodiment is given as an example and the invention is not limited thereto.

Figure 1C:
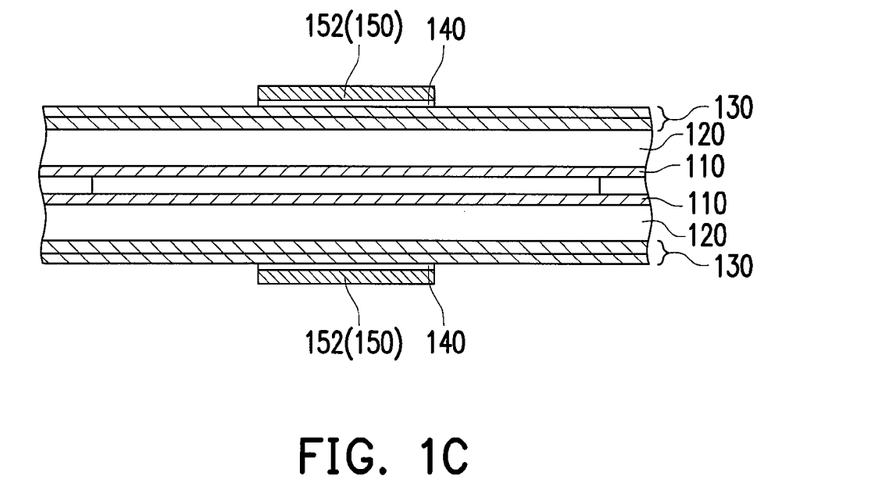

Next, with reference to FIG. 1C, two first patterned metal layers 150 are respectively formed on the two release metal films 130, wherein each of the first patterned metal layers 150 includes at least one pad pattern 152. Here, the first patterned metal layer 150 in FIG. 1C is illustrated as an example, and the descriptions of this embodiment are not intended to limit the number of the pad patterns 152. The first patterned metal layer 150 may be formed by an additive process, such as patterned electroplating, etc. However, in some other embodiments of the invention, the patterned metal layer 150 may also be formed by a subtractive process, such as etching, etc.

In addition, in an embodiment of the invention, two etch-stop layers 140, as shown in FIG. 1C, may be formed respectively on the release metal films 130 before the patterned metal layers 150 are formed. The etch-stop layer 140 may be a nickel layer that is formed on the release metal film 130 by electroplating.

Figure 1D:
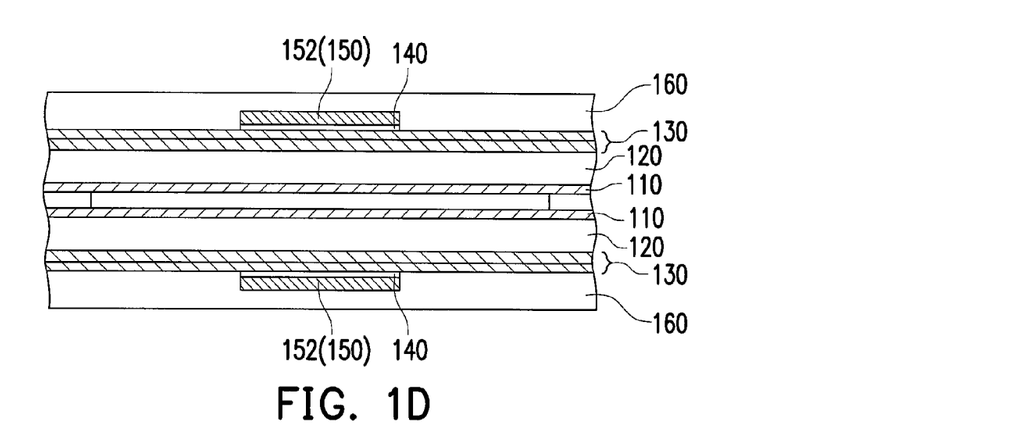
Figure 1E:
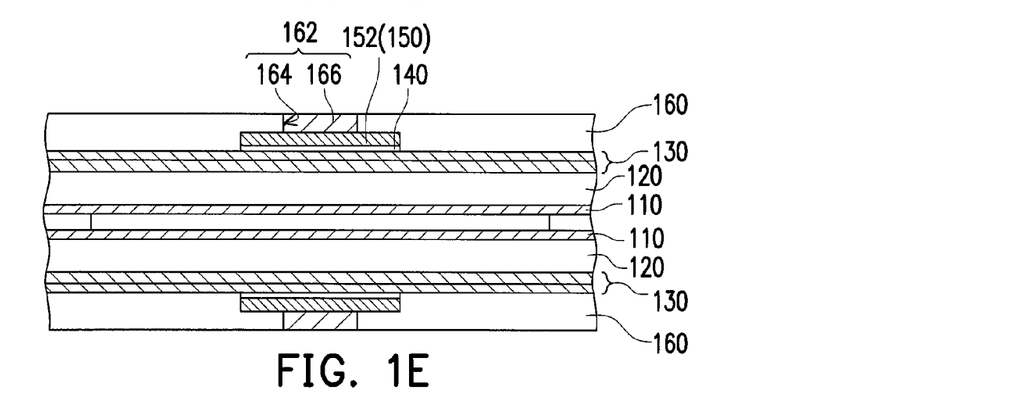

Then, with reference to FIG. 1D and FIG. 1E, two dielectric layers 160 are respectively formed on the two release metal films 130. The two dielectric layers 160 cover the corresponding first patterned metal layers 150 respectively, as shown in FIG. 1D. Following that, with reference to FIG. 1E, at least one via 164 is formed on each dielectric layer 160, wherein each via 164 exposes the corresponding pad pattern 152. Then, a conductive layer 166 is formed in each via 164, so as to form at least one conductive via 162 on each dielectric layer 160, such that each dielectric layer 160 has at least one conductive via 162 respectively connecting to the corresponding pad pattern 152. In this embodiment, the via 164 may be formed on the dielectric layer 160 by laser drilling, for example, and the conductive layer 166 may be formed in the via 164 by a method, such as chemical plating, etc. In some other embodiments, the conductive layer 166 may also be filled in the via 164 by a method such as electroplating, etc. This disclosure is not intended to limit the method of forming the conductive via 162 of the invention.

Figure 1F:
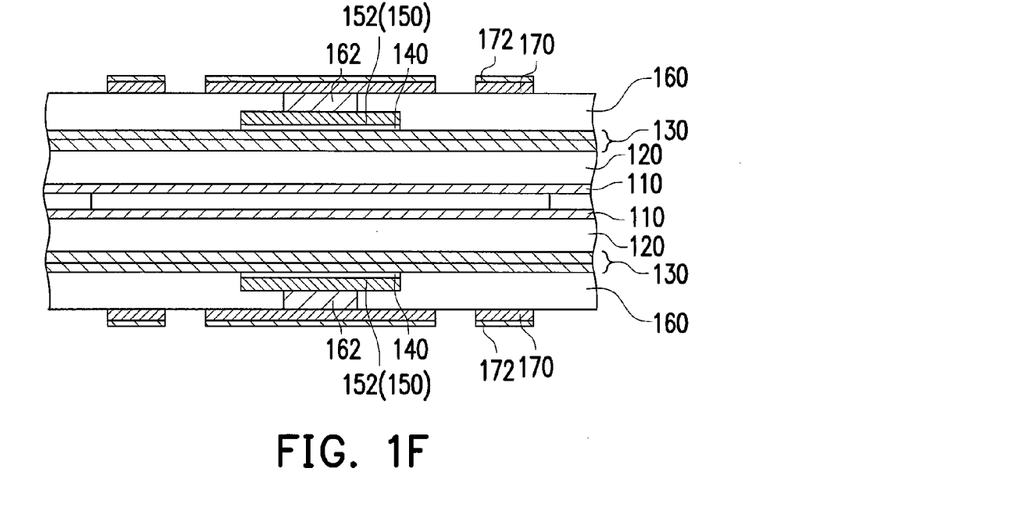

Next, with reference to FIG. 1F, two second patterned metal layers 170 are respectively formed on the two dielectric layers 160, wherein each of the second patterned metal layers 170 at least covers a top surface of the corresponding conductive via 162. In this embodiment, if a width of each circuit of each second patterned metal layer 170 is in a range of about 15-35 μm, namely, the second patterned metal layer 170 can be deemed as a thin wire, the second patterned metal layer 170 may be formed by an additive process, such as patterned electroplating, etc. To be more specific, a method of forming the second patterned metal layer 170 may include the following steps: first, forming two patterned photoresist layers respectively on the two dielectric layers 160, wherein each of the patterned photoresist layers exposes a portion of the corresponding dielectric layer 160 and the corresponding conductive via 162. Then, the patterned photoresist layers are used as electroplating masks for forming the second patterned metal layers 170 on the exposed portions of the dielectric layers 160 through electroplating. Thereafter, the patterned photoresist layers are removed.

Moreover, in this embodiment, two surface treatment layers 172, as shown in FIG. 1F, may be respectively formed on top surfaces of the two second patterned metal layers 170 before the patterned photoresist layers are removed. In this embodiment, the surface treatment layer 172 may include an electroplated gold layer, an electroplated silver layer, a reduced gold layer, a reduced silver layer, an electroplated nickel-palladium-gold layer, a chemical plated nickel-palladium-gold layer or an organic solderability preservatives (OSP) layer. However, it should be noted that the invention is not limited thereto. Thereafter, the patterned photoresist layers are removed, so as to form the second patterned metal layers 170 and the surface treatment layers 172 on the dielectric layers 160, as shown in FIG. 1F.

Of course, in other embodiments, the second patterned metal layers 170 may also be formed by a subtractive process, such as etching, etc. To be more specific, if the width of each circuit of each second patterned metal layer 170 is equal to or greater than 35 μm, for example, a forming method of the second patterned metal layer 170 may, for example, include the following steps: first, two second metal layers are respectively formed on the two dielectric layers 160, wherein each of the second metal layers covers the corresponding dielectric layer 160 entirely. Then, two patterned photoresist layers are formed respectively on the two second metal layers, wherein each of the patterned photoresist layers covers a portion of the corresponding second metal layer and the top surface of the corresponding conductive via 162. Next, the portions of the two second metal layers, not covered by the two patterned photoresist layers, are removed so as to form the second patterned metal layers 170. Of course, it should be understood that this disclosure is not intended to limit the forming method and circuit width of the second patterned metal layer 170 of the invention.

In addition, in this embodiment, two surface treatment layers 172 may be respectively formed on the second metal layers before the patterned photoresist layers are formed on the second metal layers. In this embodiment, the surface treatment layer 172 may include an electroplated gold layer, an electroplated silver layer, a reduced gold layer, a reduced silver layer, an electroplated nickel-palladium-gold layer, a chemical plated nickel-palladium-gold layer or an organic solderability preservatives (OSP) layer. However, it should be noted that the invention is not limited thereto. Thereafter, the subsequent patterning processes are performed on the second metal layers as well as the surface treatment layers 172, so as to form the second patterned metal layers 170 and the surface treatment layers 172, as shown in FIG. 1F, on the dielectric layers 160.

Figure 1G:
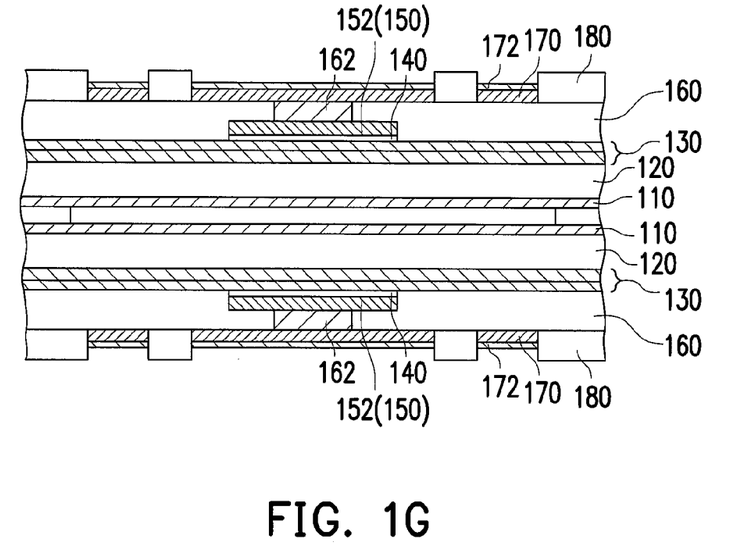
Figure 1H:
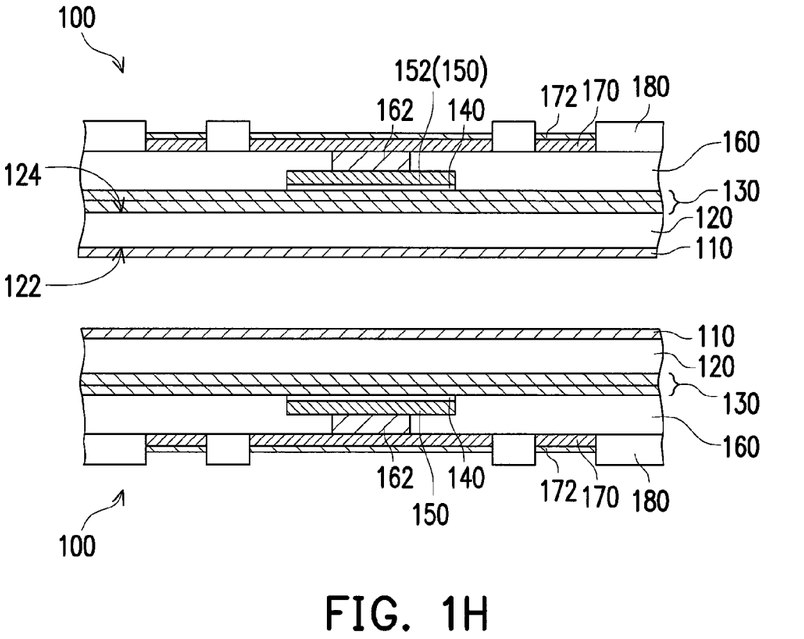

Then, with reference to FIG. 1G, two patterned solder mask layers 180 are respectively formed on the two dielectric layers 160. As shown in FIG. 1G, each of the patterned solder mask layers 180 has a plurality of openings to expose the corresponding second patterned metal layer 170. Next, as shown in FIG. 1H, the sealed region of the two base metal layers 110 is separated so as to separate the two base metal layers 110 to form two package carriers 100 that are independent from each other. Accordingly, each of the package carriers 100, formed by using the aforementioned manufacturing method, includes a supporting layer 120, a base metal layer 110, a release metal film 130, a first patterned metal layer 150, a dielectric layer 160, and a second patterned metal layer 170. The supporting layer 120 includes a first surface 122 and a second surface 124 opposite to the first surface 122. The base metal layer 110 is disposed on the first surface 122 of the supporting layer 120 while the release metal film 130 is disposed on the second surface 124 of the supporting layer 120. The release metal film 130 includes a first metal film 132 and a second metal film 134 that are separable from each other, wherein the second metal film 134 and the supporting layer 120 are bonded to each other, and the first patterned metal layer 150 is disposed on the first metal film 132 of the release metal film 130 and includes at least one pad pattern 152. The dielectric layer 160 is disposed on the release metal film 130 and covers the first patterned metal layer 150. The dielectric layer 160 has at least one conductive via 162 connecting to the corresponding pad pattern 152. The second patterned metal layer 170 is disposed on the dielectric layer 160 and at least covers the top surface of the corresponding conductive via 162.

Here, it needs to be mentioned that the package carrier 100 of this embodiment illustrates the manufacturing method of stacking single dielectric layer, however, this disclosure is not intended to limit the number of the stacked layers of the package carrier 100. Persons with ordinary skill in the art would be able to modify and adjust the number of the stacked layers of the package carrier 100 to meet the requirements of the products. Moreover, since the package carriers are manufactured in a symmetrical manner in this embodiment, two independent package carriers can be obtained simultaneously after separation (i.e. after separating the two base metal layers 110), which effectively saves production time and improves production efficiency.

Figure 2A:
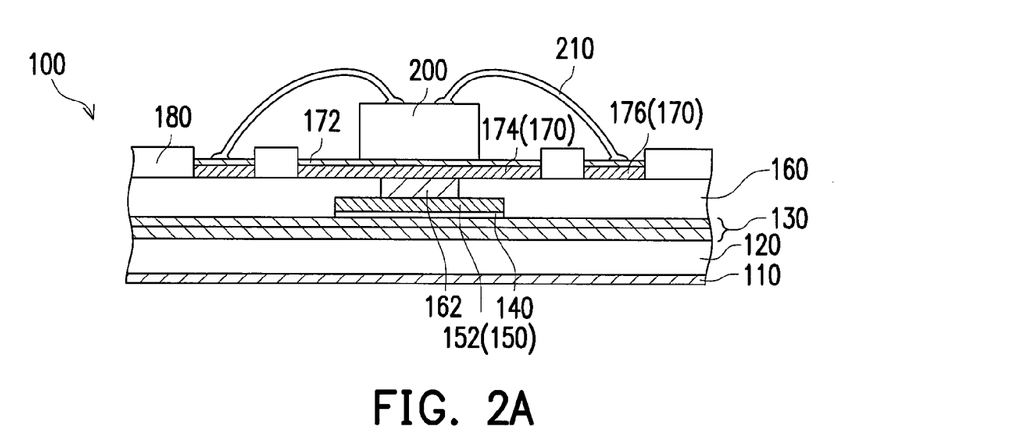
FIG. 2A to FIG. 2C are schematic cross-sectional views illustrating processes of carrying a chip on the package carrier of FIG. 1H.
Figure 2B:
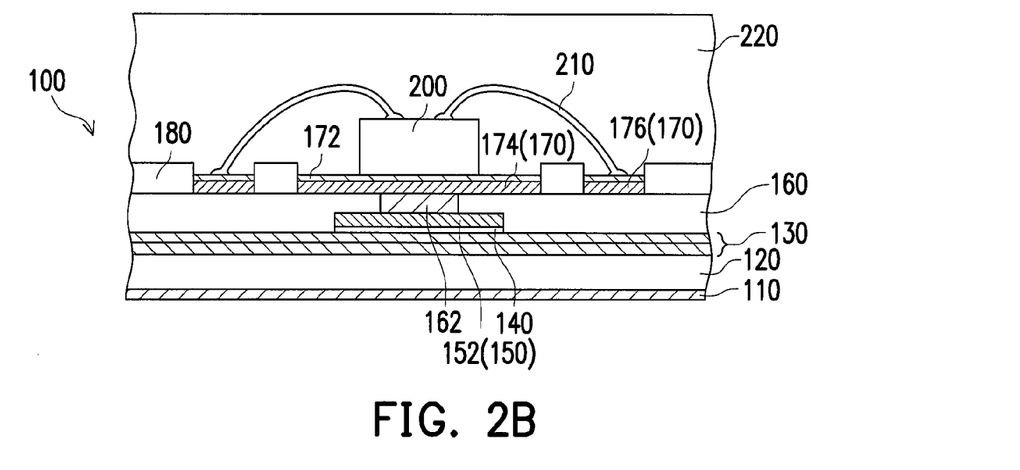
Figure 2C:
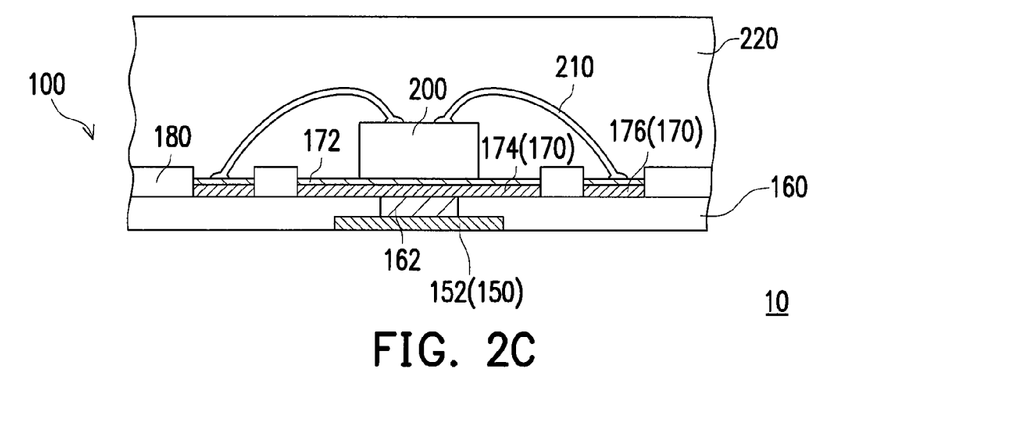

FIG. 2A to FIG. 2C are schematic cross-sectional views illustrating processes of carrying a chip on the package carrier of FIG. 1H. First, referring to FIG. 2A, in this embodiment, the package carrier 100 formed by the aforementioned manufacturing method is capable of carrying and electrically connecting a chip 200. In this embodiment, the chip 200 is a single chip or a chip module having multiple chips, for example. The disclosure of this embodiment is not intended to limit the type of the chip 200. The second patterned metal layer 170 may include at least a chip pad 174 and a plurality of bonding pads 176, wherein the chip 200 may be disposed on the chip pad 174 by an adhesive layer and the chip 200 may be electrically connected to the bonding pads 176 of the second patterned metal layer 170 by at least one conductive wire 210, for example. In other words, the chip 200 of this embodiment is electrically connected to the second patterned metal layer 170 through wire bonding.

Then, as shown in FIG. 2B, an encapsulating process is performed to form an molding compound 220 on the package carrier 100, wherein the molding compound 220 covers the chip 200, the conductive wire 210, and a top surface of the package carrier 100. Thereafter, the first metal film 132 and the second metal film 134 are separated from each other to remove the supporting layer 120, and the release metal film 130 (e.g. the first metal film 132) that remains on the dielectric layer 160 is removed by an etching process, so as to expose the dielectric layer 160 and a bottom surface of the first patterned metal layer 150.

In this embodiment, the etch-stop layer 140 is formed on the release metal film 130 before the formation of the first patterned metal layer 150. That is to say, the etch-stop layer 140 is disposed between the first patterned metal layer 150 and the release metal film 130. Therefore, when the etching process is performed to remove the remaining release metal film 130, the etching process would be stopped by the etch-stop layer 140 so that the first patterned metal layer 150 would not be subjected to damage. Finally, the etch-stop layer 140 is removed so as to form a package structure 10, as illustrated in FIG. 2C.

Figure 3:
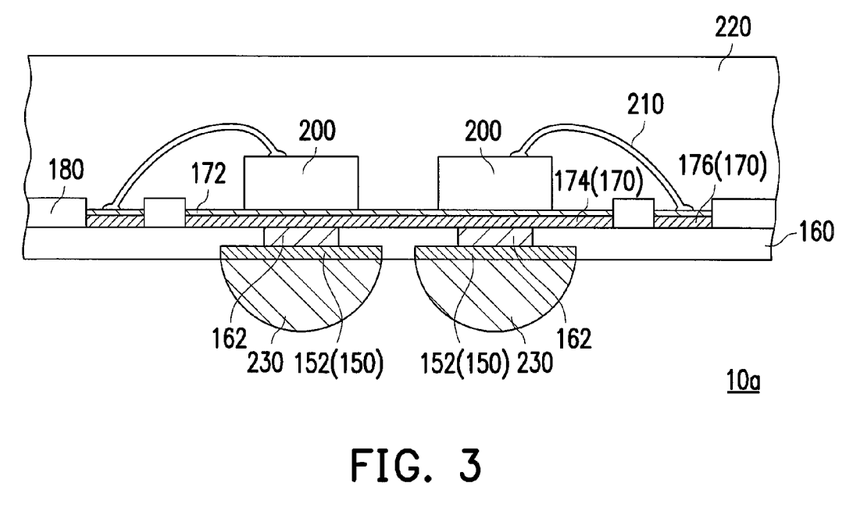
FIG. 3 is a schematic cross-sectional view of a package carrier that carries a chip thereon according to another embodiment of the invention.

FIG. 3 is a schematic cross-sectional view of a package carrier that carries a chip thereon according to another embodiment of the invention. Here, it should be mentioned that the embodiment of FIG. 3 is similar to the package structure 10 of FIG. 2C. Therefore, part of the reference numerals and contents of the previous embodiment are also used to describe this embodiment, wherein the same reference numerals are used to represent identical or similar elements, and thus descriptions of repeated technical contents will be omitted. Please refer to the descriptions of the previous embodiment for the omitted contents, which will not be repeated hereinafter.

First, with reference to FIG. 3, a package carrier of this embodiment is capable of carrying a plurality of chips 200 (two are illustrated). Based on the above, each first patterned metal layer 150 includes a plurality of pad patterns 152 corresponding to the chips 200. Accordingly, the dielectric layer 160 includes a plurality of conductive vias 162 connecting to the pad patterns 152, and the second patterned metal layer 170 also includes a plurality of chip pads 174. The chips 200 are respectively disposed on the chip pads 174 and are electrically connected to a plurality of bonding pads 176 of the second patterned metal layer 170 by a plurality of conductive wires 210. Then, a package structure 10a is electrically connected to an external electronic device by a plurality of solder balls 230, for example. In addition to the above, in this embodiment, patterned solder mask layers 180 may be selectively formed on the dielectric layer 160. As shown in FIG. 3, each patterned solder mask layer 180 has a plurality of openings to expose the corresponding second patterned metal layer 170. The conductive vias 162, as shown in FIG. 3, may be formed by performing laser drilling to form micro vias on the dielectric layer 160 and then performing chemical plating, etc., to form conductive layers in the micro vias. Or, in some other embodiments, the conductive vias 162 may be obtained by performing electroplating, etc., to form conductive posts. It should be noted that this disclosure is not intended to limit a forming method of the conductive vias 162 or the number of the chips carried on the package carrier of the invention.

In sum, the package carriers of the invention are formed by performing the manufacturing method respectively on two bonded base metal layers in a symmetrical way. Thus, after the manufacturing processes are completed, the bonded base metal layers can be separated to obtain two independent package carriers, which effectively saves production time and improves production efficiency. In addition, the invention laminates the dielectric layers onto the supporting layers and forms conductive vias and patterned metal layers on the dielectric layers so as to form the stack layers for carrying and electrically connecting the chips. Moreover, the release metal films are connected between the supporting layers and the patterned metal layers, such that the supporting layers can be easily removed due to the separation characteristics of the release metal films after the molding process. In comparison with the traditional package carrier that is formed by alternately stacking multiple patterned circuit layers and patterned dielectric layers on the core dielectric layer, the package carrier of the invention helps to reduce the overall thickness of the package structure utilizing the package carrier. Therefore, the invention not only effectively saves production time and improves production efficiency but also decreases the overall thickness of the package structure.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A manufacturing method of a package carrier, comprising:
   bonding two base metal layers to each other;
   laminating two supporting layers onto the two base metal layers respectively;
   disposing two first metal films and two second metal films on the two supporting layers respectively, wherein each of the second metal films is disposed between the supporting layer and the first metal film, and the first metal film and the second metal film are separable from each other;
   forming two patterned etch-stop layers respectively on the two first metal films;
   forming two first patterned metal layers on the two patterned etch-stop layers respectively, wherein each of the first patterned metal layers comprises at least one pad pattern, and the two first patterned metal layers are disposed on the two patterned etch-stop layers respectively;
   forming two dielectric layers on the two first patterned metal layers respectively and covering the corresponding first patterned metal layers, wherein each of the dielectric layers comprises at least one conductive via respectively connecting the corresponding pad pattern;
   forming two second patterned metal layers on the two dielectric layers respectively, wherein each of the second patterned metal layers at least covers a top surface of the corresponding conductive via;
   separating the two base metal layers from each other to form two package carriers independent from each other;
   separating the two second metal films, the two supporting layers, and the two base metal layers from the first metal films;
   removing the first metal films by an etching process, wherein the etching process is stopped by the patterned etch-stop layers; and
   removing the patterned etch-stop layers from the first patterned metal layers after removing the first metal films.

2. The manufacturing method as claimed in claim 1, wherein a thickness of the second metal film is greater than a thickness of the first metal film.

3. The manufacturing method as claimed in claim 1, wherein the step of each of the dielectric layers comprising the at least one conductive via comprises:

forming at least one via on each of the dielectric layers, wherein each of the at least one via exposes the corresponding pad pattern; and
   forming a conductive layer in each of the at least one via to form the at least one conductive via on each of the dielectric layers.

4. The manufacturing method as claimed in claim 3, wherein a method of forming the conductive layer in each of the at least one via comprises chemical plating or electroplating.

5. The manufacturing method as claimed in claim 1, wherein the step of forming the two second patterned metal layers respectively on the two dielectric layers comprises:
   forming two patterned photoresist layers respectively on the two dielectric layers, wherein each of the patterned photoresist layers exposes a portion of the corresponding dielectric layer and the corresponding conductive via;
   forming the two second patterned metal layers respectively on the exposed portions of the two dielectric layers by using the two patterned photoresist layers as masks; and
   removing the two patterned photoresist layers.

6. The manufacturing method as claimed in claim 5, wherein a thickness of each of the second patterned metal layers is in a range of 15 μm to 35 μm.

7. The manufacturing method as claimed in claim 1, wherein the step of forming the two second patterned metal layers respectively on the two dielectric layers comprises:
   forming two second metal layers respectively on the two dielectric layers;
   forming two patterned photoresist layers respectively on the two second metal layers, wherein each of the patterned photoresist layers covers a portion of the corresponding second metal layer and the corresponding conductive via; and
   removing portions of the two second metal layers, which are not covered by the two patterned photoresist layers, to form the two second patterned metal layers on the two dielectric layers.

8. The manufacturing method as claimed in claim 7, wherein a thickness of each of the second patterned metal layers is equal to or greater than 35 μm.

9. The manufacturing method as claimed in claim 1, wherein the two patterned etch-stop layers comprise electroplating nickel layers.

10. The manufacturing method as claimed in claim 1, further comprising:
    forming two patterned solder mask layers respectively on the two dielectric layers and exposing the corresponding second patterned metal layers after respectively forming the two second patterned metal layers on the two dielectric layers.

11. The manufacturing method as claimed in claim 1, further comprising:
    forming two surface treatment layers respectively on the two second patterned metal layers after respectively forming the two second patterned metal layers on the two dielectric layers.

12. The manufacturing method as claimed in claim 11, wherein each of the surface processing layers comprises an electroplated gold layer, an electroplated silver layer, a reduced gold layer, a reduced silver layer, an electroplated nickel-palladium-gold layer, a chemical plated nickel-palladium-gold layer or an organic solderability preservatives (OSP) layer.

* * * * *